US010288640B2

(12) United States Patent
Zabulon et al.

(10) Patent No.: US 10,288,640 B2
(45) Date of Patent: May 14, 2019

(54) METHOD FOR MEASURING THE ROTATION SPEED OF A VEHICLE WHEEL

(71) Applicant: SAFRAN LANDING SYSTEMS, Velizy Villacoublay (FR)

(72) Inventors: Joel Zabulon, Chevilly-Larue (FR); David Frank, Paris (FR); Guillaume Fallet, Versailles (FR)

(73) Assignee: SAFRAN LANDING SYSTEMS, Velizy Villacoublay (FR)

( * ) Notice: Subject to any disclaimer, the term of this patent is extended or adjusted under 35 U.S.C. 154(b) by 77 days.

(21) Appl. No.: 15/251,100

(22) Filed: Aug. 30, 2016

(65) Prior Publication Data
US 2017/0059603 A1  Mar. 2, 2017

(30) Foreign Application Priority Data

Aug. 31, 2015 (FR) ...................... 15 58072

(51) Int. Cl.
*G01D 5/14* (2006.01)
*G01P 3/48* (2006.01)
(Continued)

(52) U.S. Cl.
CPC .............. *G01P 3/487* (2013.01); *B60T 8/171* (2013.01); *G01D 5/145* (2013.01);
(Continued)

(58) Field of Classification Search
CPC . G01D 5/145; G01P 3/48; G01P 3/481; G06F 17/156
See application file for complete search history.

(56) References Cited

U.S. PATENT DOCUMENTS 4,827,197 A * 5/1989 Giebeler ................. B04B 9/10
318/3
5,170,365 A * 12/1992 Collopy ................. B64C 11/50
361/236
(Continued)

FOREIGN PATENT DOCUMENTS

DE  44 40 999 A1  5/1995
FR  2 875 008 A1  3/2006
FR  2875008 A1 *  3/2006 ............... G01P 3/48

OTHER PUBLICATIONS

Jang, Machine Fault Detection Using Bicoherence Spectra, IMTC 2004—Instrumentation and Measurement Technology Conference Como. Ilaly. May 18-20, 2004.*
(Continued)

*Primary Examiner* — Michael J Dalbo
(74) *Attorney, Agent, or Firm* — Sughrue Mion, PLLC

(57) ABSTRACT

A method for measuring the rotation speed of a wheel including the steps of: acquiring an analog measurement signal (Sma) generated by a magnetic tachometer and containing a useful signal the frequency of which is representative of the rotation speed of the wheel; digitizing in real-time the analog measurement signal (Sma) in order to obtain a time-dependent digital measurement signal (Smnt); calculating a Fourier transform of the time-dependent digital measurement signal (Smnt) in order to obtain a frequency-dependent digital measurement signal (Smnf); and carrying out a frequency analysis in order to identify by a search for peaks a useful spectral line (16) so as to obtain the frequency of the useful signal and therefore the rotation speed of the wheel.

9 Claims, 3 Drawing Sheets

(51) Int. Cl.
  *B60T 8/171* (2006.01)
  *G01D 5/244* (2006.01)
  *G01P 21/02* (2006.01)
  *G01P 3/487* (2006.01)
  *G01R 23/16* (2006.01)
  *G06F 17/15* (2006.01)

(52) U.S. Cl.
  CPC ............ *G01D 5/24409* (2013.01); *G01P 3/48* (2013.01); *G01P 21/02* (2013.01); *G01R 23/16* (2013.01); *G06F 17/156* (2013.01)

(56) References Cited

U.S. PATENT DOCUMENTS

| | | | |
|---|---|---|---|
| 5,396,436 A * | 3/1995 | Parker | G01M 1/225 700/279 |
| 6,082,084 A * | 7/2000 | Reimers | A01D 69/02 56/10.8 |
| 6,445,995 B1 | 9/2002 | Mollmann | |
| 6,459,955 B1 * | 10/2002 | Bartsch | A47L 9/00 700/245 |
| 2002/0091472 A1 * | 7/2002 | Jager | B60K 28/16 701/30.3 |
| 2003/0021365 A1 * | 1/2003 | Min | H04L 1/0001 375/343 |
| 2004/0187581 A1 | 9/2004 | Kamiya et al. | |
| 2008/0015089 A1 * | 1/2008 | Hurwitz | G06F 19/00 482/8 |
| 2008/0125948 A1 * | 5/2008 | Matsuda | B60T 8/172 701/83 |
| 2011/0036166 A1 * | 2/2011 | Lenz | G01M 1/16 73/455 |
| 2012/0024266 A1 * | 2/2012 | Serra | F02B 29/0418 123/564 |
| 2012/0259570 A1 | 10/2012 | Zhang et al. | |

OTHER PUBLICATIONS

Communication dated Jul. 11, 2016, from the French Patent Office in counterpart French application No. 15 58072.

\* cited by examiner

METHOD FOR MEASURING THE ROTATION SPEED OF A VEHICLE WHEEL

CROSS REFERENCE TO RELATED APPLICATIONS

This application claims priority based on French Patent Application No. 15 58072 filed Aug. 31, 2015, the contents of which are incorporated herein by reference in its entirety.

The invention relates to the measurement of the rotation speed of a vehicle wheel.

BACKGROUND OF THE INVENTION

The tachometers generally used to measure the rotation speed of aircraft wheels are magnetic analogue tachometers (also called inductive analogue tachometers).

Such a tachometer conventionally includes a rotating portion securely fastened to the wheel and equipped with magnets or toothed elements made from a ferromagnetic material, and a fixed portion comprising a magnetic sensor (coil of conductive wire, Hall-effect sensor, etc.) delivering a periodic measurement signal generated by a magnetic-field variation resulting from the rotation of the wheel.

The frequency and/or amplitude of this measurement signal are proportional to the rotation speed of the wheel.

The measurement signal is acquired by an electronic measurement module connected by a cable to the tachometer.

When the frequency of the measurement signal is used to obtain the rotation speed of the wheel, the electronic measurement module estimates the time between two overshoots of a threshold (or current) voltage by the measurement signal, and deduces therefrom the rotation speed of the wheel.

Alternatively, the electronic measurement module uses a first voltage threshold for positive values of the measurement signal and a second voltage threshold for negative values of the measurement signal (hysteresis thresholding).

Such a measurement signal 1 is shown in FIG. 1. The electronic measurement module generates from the measurement signal 1 and from comparison with a first voltage threshold S1 and with a second voltage threshold S2 a logic signal 2. The logic signal 2 activates a "timer" on the rising state or falling state of the logic signal 2, thereby allowing a measurement of the period T and therefore of the frequency of the measurement signal 1 to be obtained. Thus a measurement of the rotation speed of the wheel is obtained.

This type of measurement has certain drawbacks. As the amplitude of the measurement signal is lower at lower rotation speed, there is, for a given voltage threshold, a frequency range (and therefore rotation-speed range) for which the frequency measurement is no longer possible. It would therefore seem advantageous to decrease this threshold voltage as much as possible. However, decreasing the threshold voltage makes the measurement much more sensitive to parasitic noise resulting from various perturbations undergone by the tachometer, the electronic module or the cable: electrical perturbations (noise of the components), electromagnetic perturbations (motors and other electrical equipment) and mechanical perturbations (repercussion of the vibrations and shocks undergone by the wheel during the measurement carried out by the tachometer).

Thus, if a threshold of 0 volts were used, even the slightest parasitic noise present in the measurement signal would corrupt the measurement of the period of the measurement signal.

FIG. 2 shows the impact on a measurement signal 3 of a white noise 4 caused by such perturbations, the measurement signal 3 being compared with a first threshold voltage S3 of 0.02 volts and a second threshold voltage S4 of −0.02 volts. The measurement of the period of the measurement signal 3 is perturbed by the presence of the white noise 4 once the amplitude of the white noise exceeds one of the first or second voltage thresholds S3, S4.

The voltage thresholds are therefore particularly complex to define since they affect not only the low-frequency measurement performance of the tachometer, but also the robustness to measurement noise.

It has thus been envisaged to filter the measurement signal so as to decrease the high-frequency perturbations located outside of the useful frequency band of the measurement signal. It is however impossible to filter the low-frequency noise resulting from perturbations of mechanical origin (for example generated by mechanical resonances at a few tens or hundreds of hertz), because their frequencies correspond to the useful frequency band of the measurement signal.

FIG. 3 shows a measurement signal 5 perturbed by a low-frequency perturbation. The measured period T' of the logic signal 6 does not correspond to the rotation speed of the wheel. In this example, the wheel turns with the period 2T', and the presence of perturbations of mechanical origin generates spectral lines of amplitudes higher than the amplitude of the useful spectral line (the frequency of which is the fundamental). This effect may be observed in the spectral representation of the signal in FIG. 6, in which the useful spectral line 16 has an amplitude lower than those of the harmonic spectral lines 17: in this case, the speed measurement is erroneous.

SUBJECT OF THE INVENTION

The object of the invention is to improve the precision and reliability of the measurement of the rotation speed of a wheel of a vehicle, in particular when the rotation speed is low and/or the environment of the wheel is perturbed by perturbations of electrical, electromagnetic or mechanical origin.

SUMMARY OF THE INVENTION

With a view to achieving this aim, a method is proposed for measuring the rotation speed of a vehicle wheel, the method including the steps of:
  acquiring an analogue measurement signal generated by a magnetic tachometer and containing a useful signal the frequency of which is representative of the rotation speed of the wheel;
  digitizing in real-time the analogue measurement signal in order to obtain a time-dependent digital measurement signal;
  calculating a Fourier transform of the time-dependent digital measurement signal in an observation window in order to obtain a frequency-dependent digital measurement signal; and
  carrying out a frequency analysis on the frequency-dependent digital measurement signal so as to identify by a search for peaks a useful spectral line and to determine the frequency of the useful spectral line in order to obtain the frequency of the useful signal and therefore the rotation speed of the wheel.

The use of the Fourier transform allows the noise perturbing the measurement to be spread over the spectral domain and therefore the identification of the useful spectral line and the determination of the rotation speed of the wheel to be facilitated, even when the rotation speed of the wheel is low.

Other features and advantages of the invention will become apparent on reading the following description of one particular nonlimiting embodiment of the invention.

BRIEF DESCRIPTION OF THE DRAWINGS

Reference will be made to the appended drawings, in which.

DETAILED DESCRIPTION OF THE INVENTION

The method of the invention is here implemented to measure the rotation speed of a wheel of an aircraft.

The aircraft wheel is equipped with a magnetic tachometer that is connected, via a cable run over a landing-gear leg bearing the wheel, to an electronic measurement module integrated into a remote computer located in a hold of the aircraft. The method of the invention is here implemented by the electronic measurement module.

Figure 4:
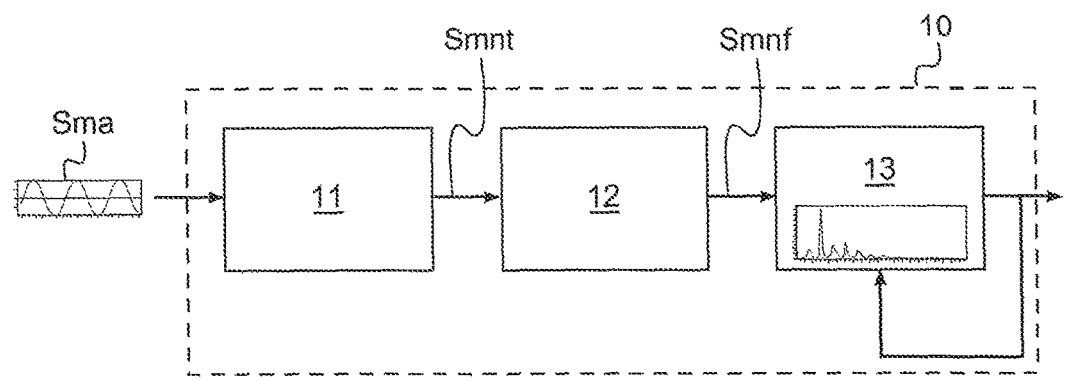
FIG. 4 is a schematic of an electronic measurement unit used to implement the method of the invention.

With reference to FIG. 4, the electronic measurement module 10 includes an analogue-digital converter 11, a computational module 12 and a frequency-analysing module 13.

The tachometer generates, when the wheel turns, an analogue measurement signal Sma. The analogue measurement signal Sma contains a useful signal the frequency of which is representative of the rotation speed of the wheel, and undesirable noise resulting from perturbations of electrical, electromagnetic or mechanical origin to which the tachometer, the cable and the electronic measurement module 10 integrated into the remote computer are subjected. The frequency of the useful signal is here proportional to the rotation speed of the wheel.

The analogue measurement signal Sma is acquired in real-time by the electronic measurement module 10 and transmitted to the analogue-digital converter 11. The analogue-digital converter 11 converts in real time the analogue measurement signal Sma (in this case it is a question of a measurement voltage) into a time-dependent digital measurement signal Smnt. The analogue-digital converter 11 used is here a 12-bit converter. With such an analogue-digital converter, it is possible to convert into a digital signal an analogue measurement signal the amplitude of which varies between 5 volts peak-to-peak and 2.5 millivolts peak-to-peak, thereby allowing analogue measurement signals of very low amplitude to be measured and therefore rotation speeds of the wheel of the aircraft clearly lower than the minimum speeds of conventional tachometers to be measured.

The time-dependent digital measurement signal Smnt is then transmitted to the computational module 12 which comprises a processing component (for example a conventional microcontroller or DSP). The time-dependent digital measurement signal Smnt is multiplied by an observation window that especially allows a duration of the analysed time-dependent digital measurement signal Smnt to be defined. The observation window is typically a Hamming window, a Blackman window, etc.

The computational module 12 computes the Fourier transform of the time-dependent digital measurement signal Smnt in the observation window. The computational module 12 produces a frequency-dependent digital measurement signal Smnf that is an instantaneous representation of the spectrum of the time-dependent digital measurement signal Smnt over the duration of the analysed time-dependent digital measurement signal Smnt.

The frequency-analysing module 13 carries out a frequency analysis on the frequency-dependent digital measurement signal Smnf so as to identify a useful spectral line and to determine the frequency of the useful spectral line in order to obtain the frequency of the useful signal representative of the rotation speed of the wheel.

It is particularly simple to determine the frequency of the useful spectral line and therefore to perform the frequency analysis when the undesirable noise is a wide-band white noise. Specifically, in this case, the Fourier transform applied to the time-dependent digital measurement signal Smnt very clearly improves the signal-to-noise ratio in the frequency domain by spreading the white noise across the entirety of the pass band.

Figure 1:
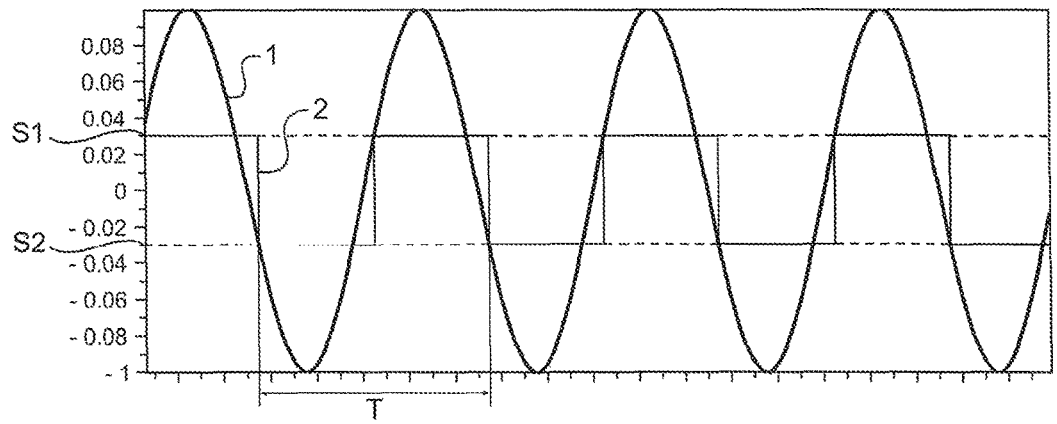
FIG. 1 is a graph in which is shown a noise-free measurement signal produced by a magnetic tachometer intended to measure a rotation speed of a vehicle wheel according to a method of the prior art.
Figure 2:
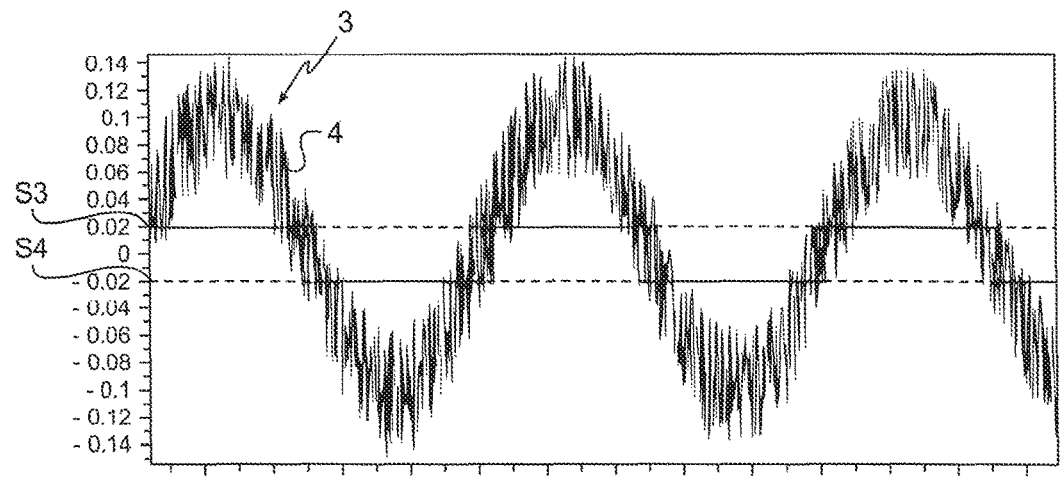
FIG. 2 is a figure analogous to FIG. 1, in which the measurement signal is perturbed by a white noise.
Figure 3:
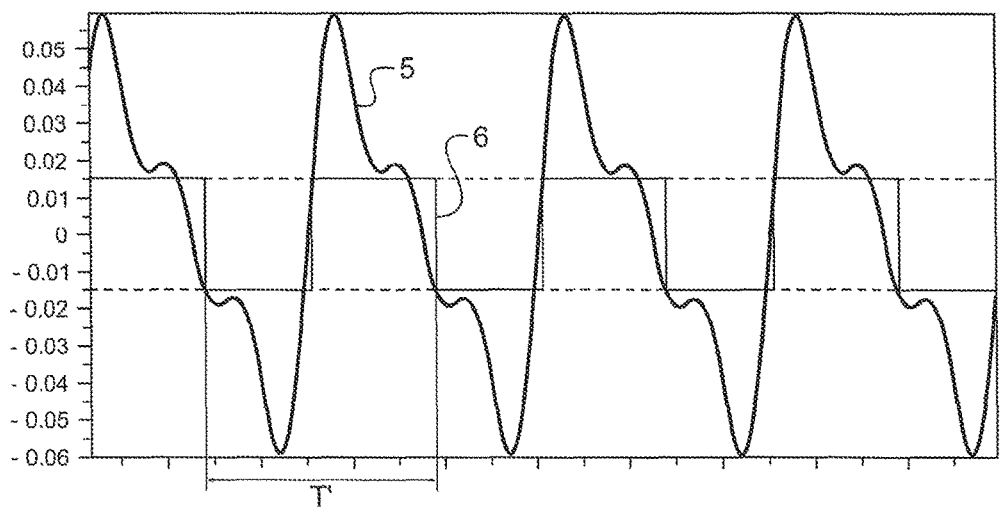
FIG. 3 is a figure analogous to FIG. 1, in which the measurement signal is perturbed by a low-frequency perturbation.
Figure 5:
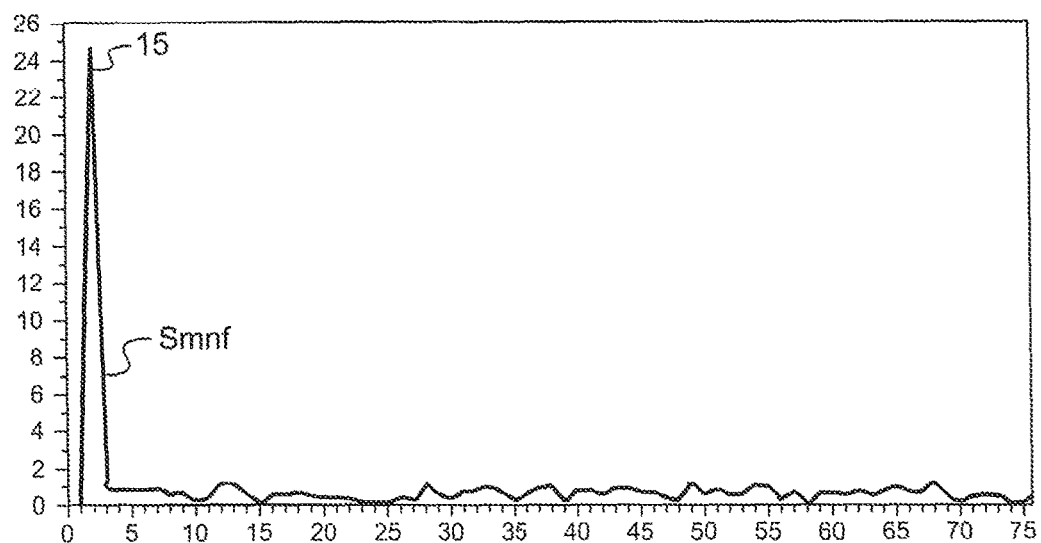
FIG. 5 shows a frequency-dependent digital measurement signal obtained by the method of the invention and perturbed by a white noise.

Thus, with reference to FIG. 5, the useful spectral line 15 of the frequency-dependent digital measurement signal Smnf that corresponds to the measurement signal 3 in FIG. 2 is easily determined by searching for peaks everywhere in the frequency domain.

However, it will be noted that the frequency analysis is more complex in a certain number of situations. Thus, in the presence of noise resulting from perturbations of mechanical origin, the deformations of the analogue measurement signal Sma result in the frequency domain in the appearance of harmonic spectral lines of large amplitude. As may be seen in FIG. 6, the useful spectral line 16 has a lower amplitude than the harmonic spectral lines 17 when the environment of the wheel of the aircraft is subject to perturbations of mechanical origin. Searching for peaks everywhere in the frequency domain does not allow the useful spectral line 16 to be determined.

To mitigate this problem, adaptive filtering is implemented that consists, in the frequency domain, in adapting the position of a spectral analysis window Fas in which the useful spectral line 16 is assumed to be found and in which the amplitude of the useful spectral line 16 corresponds to the peak of the frequency-dependent digital measurement signal Smnf.

Thus by virtue of a search for peaks in the spectral analysis window Fas the frequency of the useful spectral line 16 is determined in order to obtain the frequency of the useful signal representative of the rotation speed of the wheel.

The position of the spectral analysis window Fas is adapted depending on a prediction of the frequency of the useful spectral line 16. At each time t of acquisition of a speed measurement, the frequency of the useful spectral line 16 is predicted depending on the frequency of the useful spectral line 16 determined at the preceding acquisition time t−1. Thus, the spectral analysis window Fas is centred on the predicted frequency of the useful spectral line 16, and the actual frequency of the useful spectral line is sought in the spectral analysis window Fas via a search for peaks.

The initialization of the position of the spectral analysis window Fas depends on the conditions under which the aircraft is operating prior to the implementation of the method of the invention, i.e. prior to the moment when acquisition of the measurements of the rotation speed of the wheel for exploitation thereof begins.

When the aircraft is stopped at the moment when the method of the invention is implemented, the position of the spectral analysis window Fas is initialized so that the spectral analysis window Fas is centred on a zero initialization frequency.

When the aircraft is on the point of landing and the measured rotation speed of the wheel is on the point of passing from a zero value to a very high value, the position of the spectral analysis window Fas is initialized so that the spectral analysis window Fas is centred on an initialization frequency corresponding to this high speed value. The initialization frequency is obtained by virtue of aircraft speed measurements delivered by other sensors of the aircraft (for example the inertial measurement unit) or indeed from navigational data or computations carried out by a braking computer of the aircraft.

Likewise, when the environment of the wheel and/or of the cable and/or of the electronic measurement module 10 are particularly perturbed and the frequency-dependent digital measurement signal Smnf is very noisy, the initialization frequency is obtained by virtue of aircraft speed measurements delivered by other sensors of the aircraft (for example the inertial measurement unit) or indeed from navigational data or computations carried out by a braking computer of the aircraft.

Figure 6:
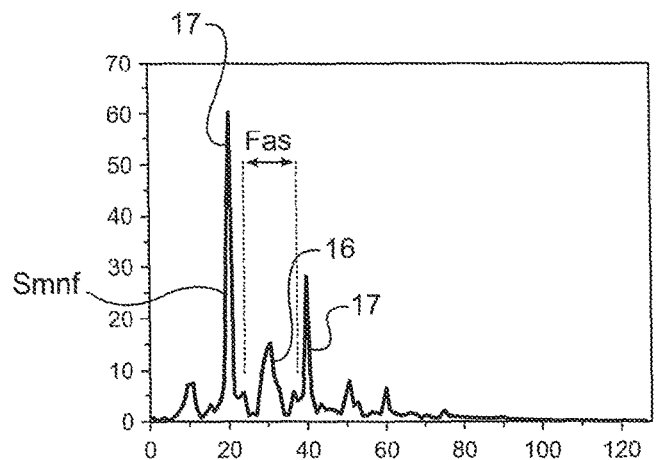
FIG. 6 shows a frequency-dependent digital measurement signal resulting, during the implementation of the method of the invention, from the calculation of the Fourier transform of an analogue measurement signal perturbed by a noise of mechanical origin.

Thus, in the situation illustrated in FIG. 6, an initialization frequency precise to +/−4 revolutions per minute and associated with a window of 10 revolutions per minute width allows the harmonics 17 to the left and to the right of the useful spectral line 16 to be eliminated and the prediction to be effectively initialized.

The width of the spectral analysis window Fas is for its part adapted depending on the level of perturbations present in the frequency-dependent digital measurement signal Smnf. In particular, if the perturbations of mechanical origin are weak, the amplitude of the corresponding spectral lines is very low with respect to the amplitude of the useful spectral line 16, and the problem described above and apparent in FIG. 6 no longer exists. It is therefore possible to increase the width of the spectral analysis window Fas, or even to search for the useful spectral line 16 with a whole-spectrum search for peaks.

Advantageously, the frequency-dependent digital measurement signal Smnf is interpolated prior to the frequency analysis of said frequency-dependent digital measurement signal Smnf. This interpolation makes it possible to decrease discontinuities in the digital frequency-dependent measurement signal Smnf resulting from the quantification of information during the Fourier transformation, which produces a certain number of samples that are equally spaced in the frequency domain. Thus, the peak of the frequency-dependent digital measurement signal Smnf is more accurately located and the search for the useful spectral line 16 is improved.

Figure 7:
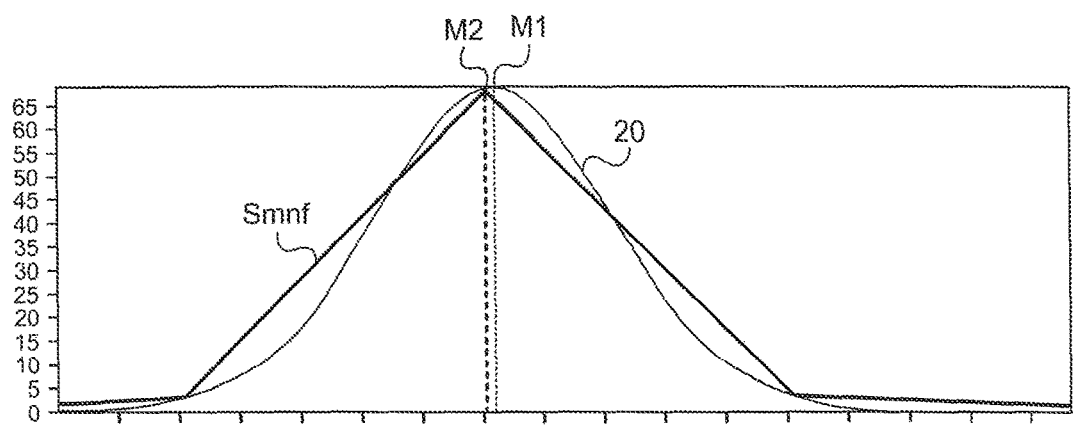
FIG. 7 shows an interpolation by a Gaussian curve of a frequency-dependent digital measurement signal obtained by the method of the invention.

As may be seen in FIG. 7, the position of the peak M1 obtained with a Gaussian interpolation curve 20 is slightly different to the position of the sought maximum M2 in the as-sampled frequency-dependent digital measurement signal Smnf. The interpolation is not necessarily an interpolation by a Gaussian curve and may be an interpolation with a simple curve, a parabolic curve, etc.

Advantageously, the frequency-analysing module 13 produces an indicator of the quality of the frequency-dependent digital measurement signal Smnf. The quality indicator is here produced based on the number of undesirable spectral lines (corresponding to the noise resulting from perturbations, to harmonics, etc.) detected during the frequency analysis.

If no undesirable spectral lines are detected, it is certain that the determined useful spectral line indeed corresponds to the frequency of the useful signal and therefore to the rotation speed of the wheel. The quality indicator is therefore excellent and the quality and integrity of the measurement may be guaranteed.

In contrast, if many undesirable spectral lines are detected, it may be necessary to cross the measurement of the rotation speed of the wheel with those of other wheels or with data delivered by other sensors of the aircraft. If the measurement is confirmed, the frequency-analysing module assigns to the measurement a good quality indicator. If the sensors deliver a different measurement, the frequency-analysing module assigns to the measurement a poor quality indicator.

The quality indicator is here especially intended to be used for other measurement filtering operations, this time in the time domain.

Advantageously, a surveillance algorithm uses the trend in the quality factor to diagnose the trend in the wear of the tachometer and of the cable, and of the degradation of the operation of the electronic measurement module 10. The surveillance algorithm thus diagnoses that a tachometer and/or a cable and/or an electronic measurement module 10 have/has failed when the quality factor degrades beyond a certain quality threshold. The surveillance algorithm may thus anticipate the failure of the tachometer and/or cable and/or electronic measurement module 10 by virtue of the trend in the quality factor and therefore inform the pilot of the aircraft, or indeed maintenance crew, of the operations to be carried out before the system formed by the tachometer, the cable and the electronic measurement module becomes inoperational.

The invention is not limited to the particular embodiment just described but, on the contrary, covers any variant encompassed by the scope of the invention such as defined by the claims.

Although the method of the invention was implemented to measure the rotation speed of an aircraft wheel, it may perfectly well be used to measure the rotation speed of a wheel of a different vehicle (automobile, etc.).

The invention claimed is:

1. A method for measuring the rotation speed of a vehicle wheel with a noise reduced system having a magnetic tachometer, an electronic management module (10), a processor-based analogue-to-digital converter (11), a computational module (12), and a frequency analyzing module (13), the method comprising:

acquiring in real time by the computer-based electronic management module (10) an analogue measurement signal (Sma) generated by the magnetic tachometer and containing a useful signal the frequency of which is representative of the rotation speed of the wheel;

digitizing by the processor-based analogue to digital converter (11) in real-time the analogue measurement signal (Sma) in order to obtain a time-dependent digital measurement signal (Smnt);

calculating by the processor-based computational module (12) a Fourier transform of the time-dependent digital measurement signal (Smnt) in an observation window in order to obtain a frequency-dependent digital measurement signal (Smnf); and carrying out a frequency analysis by the frequency analyzing module (13) on the frequency-dependent digital measurement signal so as to identify by a search for peaks a useful spectral line (15; 16) and to determine the frequency of the useful spectral line in order to obtain the frequency of the useful signal, which corresponds to the rotation speed of the wheel, wherein the frequency analysis by the frequency analyzing module includes implementing adaptive filtering, wherein the adaptive filtering consists in adapting the position of a spectral analysis window (Fas) in which the useful spectral line (15; 16) is assumed to be found depending on a prediction of the frequency of the useful spectral line (15; 16), and wherein the width of the spectral analysis window (Fas) is adapted depending on the level of perturbations present in the frequency-dependent digital measurement signal (Smnf), whereby an accurate rotation speed of the wheel is obtained without an undesirable effect of noise resulting from perturbations of electrical, electromagnetic or mechanical origin to which at least the tachometer and the electronic measurement module (10) are subjected.

2. The method according to claim 1, wherein the prediction of the frequency of the useful spectral line at a certain time depends on the frequency of the useful spectral line determined at a preceding time.

3. The method according to claim 2, wherein the prediction of the frequency of the useful spectral line is initialized with a zero initialization frequency when the vehicle is stopped, upon an initialization of the useful spectral line.

4. The method according to claim 2, wherein the prediction of the frequency of the useful spectral line is initialized with an initialization frequency delivered by another sensor of the vehicle when the vehicle is not stopped, upon an initialization of the useful spectral line.

5. The method according to claim 1, wherein a parabolic, Gaussian or simple interpolation is carried out on the frequency-dependent digital measurement signal (Smnf).

6. The method according to claim 1, wherein an indicator of the quality of the measurement of the rotation speed of the wheel is calculated depending on quality characteristics of the frequency-dependent digital measurement signal.

7. The method according to claim 6, wherein the quality indicator depends on the number of spectral lines present in the frequency-dependent digital measurement signal (Smnf).

8. The method according to claim 6, wherein the calculation of the quality indicator integrates measurement results delivered by another sensor of the vehicle.

9. The method according to claim 6, wherein the quality indicator is used to deliver a diagnosis of the state of the magnetic tachometer and/or of another piece of equipment used to acquire the analogue measurement signal (Sma).

\* \* \* \* \*